Dec. 14, 1954

A. SZERLIP 2,697,172

PULSE KEYED CRYSTAL CONTROLLED OSCILLATOR

Filed Feb. 15, 1954

INVENTOR.
ALEXANDER SZERLIP,
BY Nicholas T Volsk
HIS ATTORNEY.

United States Patent Office 2,697,172
Patented Dec. 14, 1954

2,697,172

PULSE KEYED CRYSTAL CONTROLLED OSCILLATOR

Alexander Szerlip, Los Angeles, Calif., assignor to Hughes Aircraft Company, Culver City, Calif., a corporation of Delaware Application February 15, 1954, Serial No. 410,086

15 Claims. (Cl. 250—36)

Figure 1:
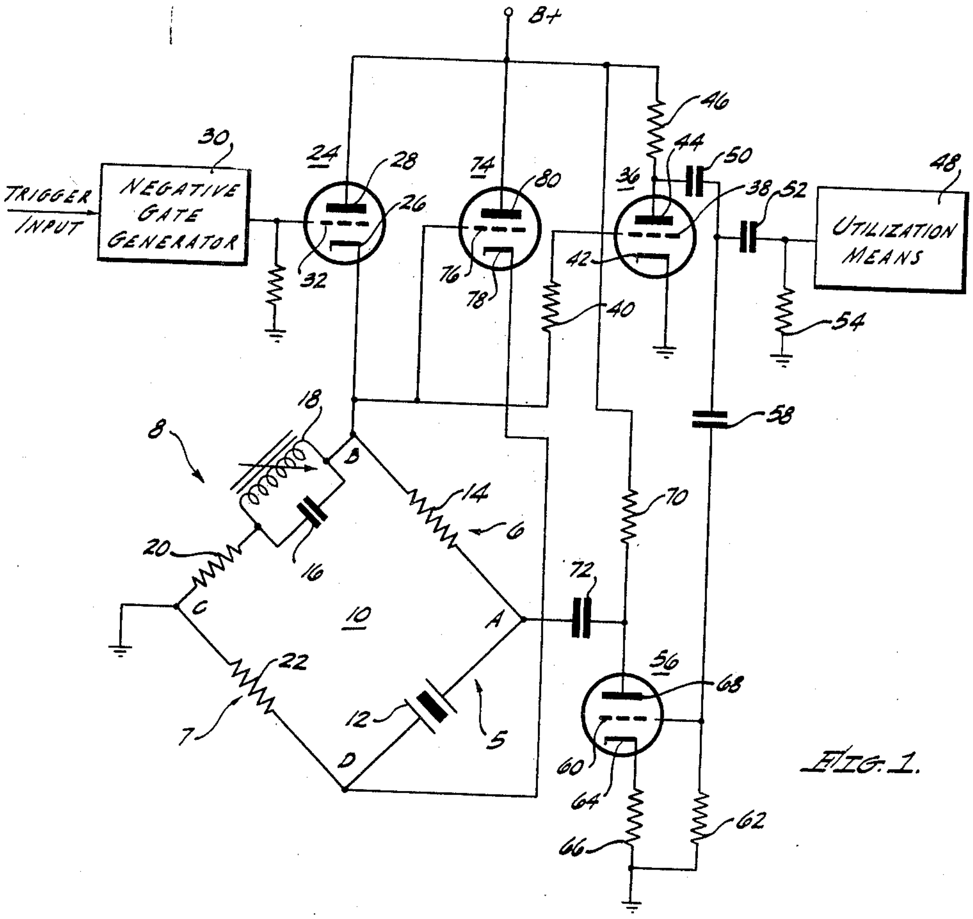

This invention relates to a triggered crystal-controlled oscillator and more particularly to a crystal-controlled oscillator which oscillates only during the duration of a pulse applied thereto.

Although the crystal-controlled oscillator disclosed herein can be used in many circuits, it has particular utility in a precision marker generator. The need for a precision marker generator to provide single or multiple visual time base markers on a cathode ray display device arises in connection with electronic systems such as radar, communication and laboratory instruments. This marker generator must be highly accurate and extremely stable in its operation.

In order to obtain the most precision, most precision marker generators employ crystal-controlled continuous sine-wave oscillators. This limits the flexibility of the electronic system, since the timing of the markers generated during successive sweeps of the cathode ray display device will not coincide with the timing of successive corresponding sweeps unless an exact harmonic relationship exists between the oscillator frequency and the sweep frequency. It is therefore desirable to provide an oscillator which can be triggered into operation for a given time interval at the beginning of each sweep of the cathode ray display device so that the oscillations always bear the same phase relationship with respect to the beginning of each sweep. However, there are few crystal-controlled oscillator circuits capable of being triggered into operation. One particular oscillator circuit which can be so triggered requires shock excitation applied directly to the quartz crystal. The output of this oscillator circuit consists of damped oscillations which last only one thousand microseconds. This is too short a time base for many applications. In addition, the decay in amplitude of the oscillations causes timing intervals errors. Furthermore, only special cuts of crystals can be shock excited into oscillation, and they oscillate in many modes.

It is therefore an object of this invention to provide a crystal-controlled oscillator which is readily capable of being triggered into operation.

It is a further object of this invention to provide a crystal-controlled oscillator which sustains oscillations after being triggered into operation.

It is a still further object of this invention to provide a crystal-controlled oscillator which sustains oscillations at a constant amplitude after being triggered into operation.

It is a still further object of this invention to provide a crystal-controlled oscillator which is triggered into operation by the leading edge of a square-wave pulse applied thereto to produce oscillations, having a constant amplitude, only for the duration of the pulse.

It is a still further object of this invention to provide a crystal-controlled oscillator readily capable of being triggered into operation which employs standard crystal cuts.

Briefly, the invention contemplates the use of a bridge circuit, in which one arm includes a piezoelectric quartz crystal resonant at a given frequency, its conjugate arm includes a tuned parallel LC circuit resonant at slightly higher than the given frequency, and the two remaining arms include only resistances. Means are provided for shock exciting the tuned circuit into oscillation. The shock-excited oscillations are amplified by a first amplifier and then applied to the bridge circuit in proper phase to provide regenerative feedback to thereby sustain oscillation. The magnitude of the regenerative feedback is determined by the impedance of the bridge circuit, and this impedance in turn depends upon the crystal impedance. Therefore, the oscillator will oscillate at that frequency where the impedance of the crystal is such as to provide the most regenerative feedback. In order to provide greater frequency stability the shock excited oscillations are separately amplified by a second amplifier and then applied to the bridge circuit in proper phase to provide degenerative feedback, the magnitude of which varies with crystal impedance in an opposite sense with respect to the variation in the regenerative feedback with crystal impedance. Therefore, at the frequency at which there is the most regenerative feedback there is the least degenerative feedback, and vice versa.

The features of the invention which are believed to be novel are set forth with particularity in the appended claims. The invention itself, however, both as to its organization and method of operation, can best be understood by reference to the following description taken in conjunction with the accompanying drawing, in which Fig. 1 is a block and schematic circuit diagram of the preferred embodiment of the invention; and Fig. 2 shows the waveforms of the input and output signals of the oscillator illustrated in Fig. 1.

Figure 2:
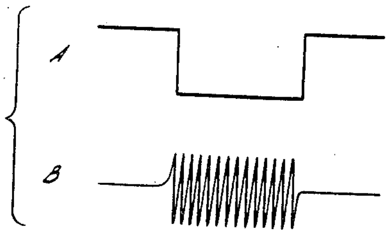

Referring now to Fig. 1, the bridge circuit 10 comprises series connected first, second, third and fourth arms numbered 5, 6, 7 and 8, respectively. First arm 5 comprises a piezoelectric crystal 12 having a selected natural frequency. The second and fourth arms include resistances 14 and 22, respectively. The third arm comprises a resistor 20 serially connected to a parallel resonant circuit 16–18 which is tuned to a frequency slightly higher than the natural frequency of the crystal.

One end of each of the second and fourth arms are connected respectively to the first and second free ends of arm 5 to form junctions A and D, respectively. The third arm 8 is serially connected at one end to the free end of the second arm 6 to form junction B and the other end of third arm 8 is serially connected to the free end of fourth arm 7 to form junction C.

Junction C of bridge circuit 10 is connected to a point of reference potential. Electron tube 24 has its cathode 26 connected to junction B of bridge circuit 10 and its anode 28 connected to a source of potential which is positive relative to the point of reference potential.

A trigger pulse from an external source, such as, for example, the master keyer in a radar system, is applied to the input of a negative gate generator 30. Negative gate generator 30 is any device, such as a monostable multivibrator, which produces a single negative square-wave pulse of a given duration which is initiated either in time coincidence with or a given time delay after the application of a trigger pulse thereto. The output of negative gate generator 30 is applied to control electrode 32 of electron tube 24.

Electron tube 36 is utilized as both an amplifier and a link in the feedback path. Its control electrode 38 is connected to junction B of bridge circuit 10 through bias resistance 40. Cathode 42 of electron tube 36 is connected to the point of reference potential and anode 44 of electron tube 36 is connected to the point of positive potential through load resistance 46. The output of electron tube 36 is coupled to the input of utilization means 48 by serially connected capacitors 50 and 52. If the oscillator is utilized in a marker generator, utilization means 48 includes a device, such as a monostable blocking oscillator, for converting the sinusoidal output of the oscillator to marker pulses having a repetition frequency equal to either the oscillator frequency or a sub-harmonic thereof, and the cathode ray display device to which the marker pulses are applied.

The output of electron tube 36 is also coupled through capacitors 50 and 58 to the grid 60 of electron tube 56. Cathode 64 of electron tube 56 is connected to the point of reference potential through bias resistance 66. Anode 68 of electron tube 56 is connected to a source of positive potential through load resistance 70. The anode 68 of electron tube 56 is coupled to junction A of bridge circuit 10 through capacitance 72.

Electron tube 74 has its control electrode 76 connected to junction B of bridge circuit 10, its cathode 78 connected to junction D of bridge circuit 10, and its anode 80 connected to the source of positive anode potential.

The method of operation of the circuit shown in Fig. 1 will now be considered. Electron tube 24 is connected as a cathode follower with arm 8 of bridge circuit 10 being its cathode load impedance. In its quiescent state electron tube 24 draws current through inductance 18 and resistance 20. The voltage drop across resistance 20 properly biases electron tube 24. The output impedance of a cathode follower 24 is extremely low because it is normally in a conducting condition. Therefore, when electron tube 24 is in a quiescent state the impedance between junctions B and C of bridge circuit 10 is so low that there is no tendency for the circuit to oscillate.

The application of a trigger pulse to negative gate generator 30 results in a negative square-wave pulse, shown in Fig. 2A, being impressed in the grid of electron tube 24. The negative square-wave pulse has sufficient amplitude to cut off electron tube 24, thereby greatly increasing the effective impedance existing between junctions B and C of bridge circuit 10 and in addition the sudden cutting off of electron tube 24, results in the tuned circuit composed of capacitance 16 and inductance 18 being shock excited into oscillation. The ensuing oscillation would gradually vanish due to the damping of the circuit unless energy is continuously injected back into the oscillating circuit.

These oscillations, appearing between junctions B and C of bridge circuit 10, are applied through resistance 40 to the input of amplifier tube 36. The purpose of resistance 40 is to provide sufficient bias for electron tube 36 to overcome the positive potential which exists at junction B of bridge circuit 10 due to the interelectrode current of tube 24 when it is in its quiescent state.

The amplified oscillations appearing in the output of electron tube 36 are impressed on the control electrode of amplifier tube 56. The still further amplified oscillations appearing at the anode of electron tube 56 are applied between junctions A and C of bridge circuit 10. The arms of bridge circuit 10 between junctions A and B and between junctions B and C form a voltage divider, so that a fixed proportion of the amplified oscillations applied between junctions A and C of bridge circuit 10 appear between junctions B and C of bridge circuit 10 and are fed back as an input to electron tube 36. Since the output of each of electron tubes 36 and 56 is phase inverted relative to its respective input, the output of electron tube 56, appearing between junctions A and C of bridge circuit 10, will be in phase with the input to electron 36, appearing between junctions B and C of bridge circuit 10. Therefore, the fixed proportion of the oscillations fed back to the input of electron tube 36 are of proper phase to provide regeneration, and the conditions for sustained oscillation are fulfilled.

The manner by which crystal 12 controls the frequency of oscillations will now be discussed. It is well known that the equivalent circuit of a crystal is a serially connected capacitance, inductance and resistance all shunted by a capacitance. Such a circuit is series resonant at a first frequency and is parallel resonant at a second frequency slightly higher than the first frequency. The second frequency is utilized in the present invention. All other things being equal, the higher the total impedance presented by bridge circuit 10 between junctions A and C, the greater will be the magnitude of the oscillations appearing between junctions A and C of bridge circuit 10. Furthermore, the higher the impedance of crystal 12, the higher will be the total impedance presented by bridge circuit 10 between junctions A and C. Crystal 12 has its highest impedance at the frequency at which it is parallel resonant. Therefore, the magnitude of the oscillations appearing between junctions A and C of bridge circuit 10 will be greatest at the parallel resonant frequency of crystal 12. Since a fixed proportion of the oscillations appearing between junctions A and C of bridge circuit 10 appear between junctions B and C of bridge circuit 10, the magnitude of this fixed proportion will also be greatest at the parallel resonant frequency of crystal 12. However, the oscillations appearing between junctions B and C of bridge circuit 10 are applied as an input to electron tube 36, and the magnitude of the amplified oscillations appearing between junctions A and C of bridge circuit 10 is proportional to the magnitude of the input applied to electron tube 36. Therefore, the effect is cumulative and the oscillator will oscillate at a much higher amplitude at the parallel resonant frequency of crystal 12 than at any other frequency.

Since the tuned circuit composed of capacitance 16 and inductance 18 is resonant at a frequency somewhat higher than the natural resonant frequency of crystal 12, that is, its series resonant frequency, the original shock excited oscillations will have a frequency approximating the parallel resonant frequency of crystal 12, so that the oscillator will lock in at the parallel resonant frequency of crystal 12 after no more than two cycles of oscillation. However, if the tuned circuit is resonant at a frequency too far removed from the parallel resonant frequency of crystal 12, the crystal will not take control and the oscillator will oscillate at a lower amplitude at the resonant frequency of the tuned circuit.

It has been found that with the circuit as so far described, the oscillations include spurious frequencies. These spurious frequencies can be removed and the frequency stability of the oscillator improved by providing a separate amplifier which produces a large amount of degenerative feedback at frequencies other than the parallel resonant frequency of crystal 12 and a small amount of degenerative feedback or even additional regenerative feedback at the parallel resonant frequency of crystal 12. This amplifier comprises electron tube 74 which has its control electrode 76 connected to junction B of bridge circuit 10 and its cathode 78 connected to junction D of bridge circuit 10. It will be seen that if bridge circuit 10 is balanced, junctions B and D of bridge circuit 10 will be at the same potential and electron tube 74 will have no output. If bridge circuit 10 is out of balance such that junction D is at a higher potential than junction B, electron tube 74 will have an output which is out of phase with the oscillations appearing between junctions A and C of bridge circuit 10, and which has an amplitude proportional to the potential difference existing between junctions B and D of bridge circuit 10. Similarly, if bridge circuit 10 is out of balance such that junction B is at a higher potential than junction D, electron tube 74 will have an output in phase with the oscillations appearing between junctions A and C and have an amplitude proportional to the potential difference existing between junctions B and D. Crystal 12 and resistance 22 form a voltage divider for the oscillations appearing between junctions A and C of bridge circuit 10. Since the impedance of crystal 12 is high at its parallel resonant frequency and low at all other frequencies, the potential at junction D of bridge circuit 10 will be relatively lower at the parallel resonant frequency of crystal 12 than at any other frequency. Thus, if the parameters of the bridge circuit are such that it is close to balance when crystal 12 is parallel resonant and has its highest impedance, the potential at junction D of bridge circuit 10, when crystal 12 is not parallel resonant and therefore presents a relatively low impedance, will be much higher than the potential at junction B of bridge circuit 10. Therefore, at the parallel resonant frequency of crystal 12, electron tube 74 will have practically no output, but at frequencies other than the parallel resonant frequency of crystal 12, electron tube 74 will have a high output which is out of phase with the oscillations applied between junctions A and C of bridge circuit 10. Thus, electron tube 74 causes discrimination against spurious frequencies in favor of the parallel resonant frequency of crystal 12.

After the end of the negative square-wave pulse, electron tube 24 again draws current, and effectively shunts junctions B and C of bridge circuit 10 with its low output impedance. This causes the oscillator to immediately cease oscillating.

The output of the oscillator, shown in Fig. 2B, is obtained at the output of electron tube 36 and applied as the input to utilization means 48.

While there has been described what is at present considered to be a preferred embodiment of the invention, it will be obvious to those skilled in the art that various changes and modifications may be made therein without departing from the invention, and it is aimed in the appended claims to cover all such changes and modifications as fall within the true spirit and scope of the invention.

What is claimed is:

1. A crystal-controlled oscillator including a bridge circuit composed of a first arm comprising a piezoelectric crystal resonant at a given frequency, a second arm comprising a first resistance, one end of said second arm being connected to one end of said first arm at a first junction, a third arm comprising a capacitance and inductance connected in parallel to form a tuned circuit resonant at a frequency slightly higher than said given frequency, one end of said third arm being connected to the other end of said second arm at a second junction, a fourth arm comprising a second resistance, one end of said fourth arm being connected to the other end of said third arm at a third junction and the other end of said fourth arm being connected to the other end of said first arm at a fourth junction; means coupled between said second and third junctions for shock exciting said tuned circuit into oscillation; amplifying means having its input circuit coupled between said second and third junctions; and means for coupling the output circuit of said amplifying means between said first and third junctions in proper phase to provide regenerative feedback between said second and third junctions, whereby said oscillator continuously oscillates at a frequency determined by said crystal.

2. A crystal-controlled oscillator as set forth in claim 1, wherein said third junction is connected to a point of reference potential, and wherein said amplifying means comprises a two-stage electron tube amplifier having its input electrically coupled to said second junction and its output electrically coupled with said first junction.

3. A crystal-controlled oscillator as set forth in claim 2, further including utilization means having its input circuit coupled to the output circuit of the first stage of said two-stage amplifier.

4. A crystal-controlled oscillator as set forth in claim 1, wherein said means for shock exciting said tuned circuit into oscillation includes means for effectively shunting said second and third junctions with a low impedance after a given time lapse after the shock excitation of said tuned circuit, whereby oscillation of said oscillator is terminated.

5. A crystal-controlled oscillator including a bridge circuit composed of a first arm comprising a piezoelectric crystal resonant at a given frequency, a second arm comprising a first resistance, one end of said second arm being connected to one end of said first arm at a first junction, a third arm comprising a capacitance and an inductance connected in parallel to form a tuned circuit resonant at a frequency slightly higher than said given frequency, one end of said third arm being connected to the other end of said second arm at a second junction, and a fourth arm comprising a second resistance, one end of said fourth arm being connected to the other end of said third arm at a third junction and the other end of said fourth arm being connected to the other end of said first arm at a fourth junction; means coupled across said second and third junctions for shock exciting said tuned circuit into oscillation; first amplifying means having its input circuit coupled across said second and third junctions; means for coupling the output circuit of said first amplifying means across said first and third junctions in proper phase to provide regenerative feedback between said second and third junctions; second amplifying means having its input circuit coupled across said second and third junctions; and means for coupling the output circuit of said second amplifying means across said third and fourth junctions in proper phase to provide degenerative feedback between said second and third junctions, said regenerative feedback being greater than said degenerative feedback at a frequency determined by said crystal and being less than said degenerative feedback at all other frequencies, whereby said oscillator continuously oscillates at the frequency determined by said crystal.

6. A crystal-controlled oscillator as set forth in claim 5, wherein said third junction is connected to a point of reference potential, and wherein said second amplifying means comprises an electron tube having an anode, a cathode and a control electrode, means for connecting said anode to a point of positive potential relative to said point of reference potential, means for connecting said cathode to said fourth junction, and means for connecting said control electrode to said second junction.

7. A crystal-controlled oscillator as set forth in claim 5, wherein said third junction is connected to a point of reference potential, and wherein said first amplifying means comprises a two-stage electron tube amplifier having its input coupled to said second junction and its output coupled to said first junction.

8. A crystal-controlled oscillator as set forth in claim 7, further including utilization means having its input circuit coupled to the output circuit of the first stage of said two-stage amplifier.

9. A crystal-controlled oscillator as set forth in claim 8, wherein said second amplifying means comprises an electron tube having an anode, a cathode and a control electrode, means for connecting said anode to a point of positive potential relative to said point of reference potential, means for connecting said cathode to said fourth junction, and means for connecting said control electrode to said second junction.

10. A crystal-controlled oscillator as set forth in claim 5, wherein said means for shock exciting said tuned circuit into oscillation includes means for effectively shunting said second and third junctions with a low impedance after the lapse of a selected time interval after the impression of the shock excitation to said tuned circuit, whereby oscillation of said oscillator is terminated.

11. A crystal-controlled oscillator as set forth in claim 10, wherein said third arm of said bridge circuit includes a third resistance in series with said tuned circuit; wherein said third junction is connected to a point of reference potential; and wherein said means for shock exciting said tuned circuit into oscillation comprises a negative gate generator for generating a negative square-wave pulse having a given duration which is long relative to a period of a cycle of said oscillations in response to an external trigger pulse applied thereto, an electron tube having an anode, a cathode and a control electrode, means for connecting said anode to a point of positive potential relative to said point of reference potential, means for connecting said cathode to said second junction, and means for applying said square-wave pulse to said control electrode to effect the cut-off of said electron tube only during said given duration.

12. A crystal-controlled oscillator as set forth in claim 11, wherein said first amplifying means comprises a two-stage electron tube amplifier having its input electrically coupled to said second junction and its output electrically coupled to said first junction.

13. A crystal-controlled oscillator as set forth in claim 12, wherein said two-stage amplifier comprises a second and a third electron tube each having an anode, a cathode and a control electrode, means for connecting the cathode of said second electron tube to said point of reference potential, a fourth resistance connecting the anode of said second electron tube to said point of positive potential, a fifth resistance connecting the control electrode of said second electron tube to said second junction, capacitive means connecting the anode of said second electron tube to the control electrode of said third electron tube, a sixth resistance connecting the control electrode of said third electron tube to said point of reference potential, a seventh resistance connecting the cathode of said third electron tube to said point of reference potential, an eighth resistance connecting the anode of said third electron tube to said point of positive potential, and means for connecting the anode of said third electron tube to said first junction.

14. A crystal-controlled oscillator as set forth in claim 13, wherein said second amplifying means comprises a fourth electron tube having an anode, a cathode and a control electrode, means for connecting the anode of said fourth electron tube to said point of positive potential, means for connecting the cathode of said fourth electron tube to said fourth junction, and means for connecting the control electrode of said fourth electron tube to said second junction.

15. A crystal-controlled oscillator as set forth in claim 14, further including utilization means having its input circuit coupled between the anode of said second electron tube and said point of reference potential.

References Cited in the file of this patent

UNITED STATES PATENTS

| Number | Name | Date |
|---|---|---|
| 2,303,862 | Peterson | Dec. 1, 1942 |
| 2,611,873 | Gager et al. | Sept. 23, 1952 |
| 2,638,548 | MacNichol | May 12, 1953 |